United States Patent
Kubota et al.

(10) Patent No.: US 9,455,711 B2
(45) Date of Patent: Sep. 27, 2016

(54) SEMICONDUCTOR INTEGRATED CIRCUIT DEVICE

(71) Applicant: HITACHI, LTD., Chiyoda-ku, Tokyo (JP)

(72) Inventors: Shunsuke Kubota, Tokyo (JP); Hiroyasu Yoshizawa, Tokyo (JP); Na Li, Tokyo (JP); Yoshihiro Hayashi, Tokyo (JP); Tatsuya Odawara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/806,940

(22) Filed: Jul. 23, 2015

(65) Prior Publication Data
US 2016/0043720 A1 Feb. 11, 2016

(30) Foreign Application Priority Data

Aug. 7, 2014 (JP) .................................. 2014-161531

(51) Int. Cl.
  *H03K 17/687* (2006.01)
  *H03K 19/00* (2006.01)
  *H03K 5/08* (2006.01)
  *H03K 5/003* (2006.01)

(52) U.S. Cl.
  CPC .......... *H03K 19/0016* (2013.01); *H03K 5/003* (2013.01); *H03K 5/084* (2013.01); *H03K 17/6874* (2013.01)

(58) Field of Classification Search
None
See application file for complete search history.

(56) References Cited

U.S. PATENT DOCUMENTS

| 7,466,168 | B1* | 12/2008 | Wittenbreder, Jr. | H03K 17/063 327/108 |
| 7,589,571 | B1* | 9/2009 | Wittenbreder, Jr. | H02M 3/1588 327/108 |
| 9,331,672 | B2* | 5/2016 | Zeng | H03K 3/011 |
| 2012/0108963 | A1 | 5/2012 | Hara et al. | |
| 2015/0213844 | A1* | 7/2015 | Nguyen | G11C 5/145 365/226 |
| 2015/0326217 | A1* | 11/2015 | Barrenscheen | H01L 27/0266 327/543 |
| 2016/0043720 | A1* | 2/2016 | Kubota | H03K 19/0016 327/109 |

FOREIGN PATENT DOCUMENTS

JP     2004-363997 A     12/2004
JP     2012-095168 A     5/2012

* cited by examiner

*Primary Examiner* — Lincoln Donovan
*Assistant Examiner* — Khareem E Almo
(74) *Attorney, Agent, or Firm* — Miles & Stockbridge P.C.

(57) ABSTRACT

A semiconductor integrated circuit device that has a high-voltage analog switch circuit and is operable at a low power-supply voltage, and which has a first high-voltage MOSFET HN1, a second high-voltage MOSFET, and a first floating gate voltage control circuit. The first floating gate voltage control circuit operates at a voltage of 5 V or lower, and when turning on the first high-voltage MOSFET and the second high-voltage MOSFET, the first floating gate voltage control circuit sets a voltage in the source terminal of the first high-voltage MOSFET as a reference voltage, adds a floating voltage corresponding to the power-supply voltage to the reference voltage, and supplies the added voltage to the gate terminals of the first high-voltage MOSFET and the second high-voltage MOSFET.

8 Claims, 6 Drawing Sheets

SEMICONDUCTOR INTEGRATED CIRCUIT DEVICE

TECHNICAL FIELD

The present invention relates to a semiconductor integrated circuit device, more specifically to a semiconductor integrated circuit device with a high-voltage analog switch circuit.

BACKGROUND ART

High-voltage analog switch circuit is used in various devices including a Diagnostic Ultrasound System as an example. In the case of using a high-voltage analog switch circuit in a Diagnostic Ultrasound System, the high-voltage analog switch circuit is used as a transmitted wave changeover switch circuit between a transmitter and receiver circuit and an ultrasound transducer array including a plurality of ultrasound transducers in the Diagnostic Ultrasound System, or as a changeover switch circuit between the transmitter and receiver circuit and a plurality of probes each including ultrasound transducers in the Diagnostic Ultrasound System to perform switching probe by probe, or as transmitting/receiving separating circuit in the transmitter and receiver circuit. In this case, the transmitter and receiver circuit refers to a circuit that transmits a large voltage-amplitude drive signal for driving the ultrasound transducers and receives a small voltage-amplitude signal based on a reflected wave resulting from irradiation of an ultrasound signal.

In recent years, Diagnostic Ultrasound Systems have been increasingly configured such that a large number of electronics are integrated into a semiconductor integrated circuit device and built into probes, and transmitted wave changeover switch circuits and others have also been increasingly built into the probes.

In a high-voltage analog switch circuit built into a semiconductor integrated circuit device, a high-voltage transistor with a higher withstanding voltage than a high voltage (maximum amplitude value) of a signal supplied to its input and output terminals is used as a switch for transmitting the signal supplied to the input and output terminals. In this case, for performing on-off control of the high-voltage transistor used as a switch, it is necessary to supply the high-voltage transistor with a control signal with a high voltage equal to or higher than a high voltage of a signal to be transmitted. To generate such a high-voltage control signal, a level-shift circuit operating at a high voltage equal to or higher than a high voltage of a signal to be transmitted by the high-voltage transistor as a power-supply voltage may be built into the semiconductor integrated circuit device. Accordingly, a low-voltage control signal is input into the level-shift circuit operating at a high voltage as a power-supply voltage to generate a high-voltage control signal in the level-shift circuit, and the high-voltage control signal is supplied to the high-voltage transistor for on/off control of the high-voltage transistor.

In the case of using a high-voltage analog switch circuit as a transmitted wave changeover switch circuit, a changeover switch circuit for probe-by-probe switching, or transmitting/receiving separating circuit, a drive signal for driving the ultrasound transducers is a large-amplitude signal with an amplitude of about ±100 V at maximum, for example, and therefore, the semiconductor integrated circuit device with the high-voltage analog switch circuit and the level-shift circuit needs to be supplied with voltages of +100 V and −100 V as power-supply voltages for the level-shift circuit. That is, it is necessary to supply the semiconductor integrated circuit device with power-supply voltages with a difference of 200 V therebetween. As such semiconductor integrated circuits with a high-voltage analog switch circuit, semiconductor integrated circuit devices which require power-supply voltages of +100 V and −100 V, +40 V and −160 V, or +200 V and 0 V are known, for example.

PTL 1 describes a semiconductor integrated circuit device with a high-voltage analog switch circuit.

PTL 2 describes a semiconductor integrated circuit device with an analog switch circuit. PTL 2 specifies that voltages of several tens of Volts are supplied as power-supply voltages for a circuit driving the analog switch circuit.

CITATION LIST

Patent Literatures

PTL 1: JP 2012-95168 A
PTL 2: JP 2004-363997 A

SUMMARY OF INVENTION

Technical Problem

Taking a medical Diagnostic Ultrasound System as an example, a probe is brought into contact with a human body for diagnosis. In the case of providing the probe with electronics such as a transmitted wave changeover switch, applying a high voltage as a power-supply voltage to the electronics leads to deterioration in safety of the Diagnostic Ultrasound System for the human body. The inventor of the subject application thus has studied lowering of a power-supply voltage to electronics such as a transmitted wave changeover switch circuit.

The inventor of the subject application first has studied the technique described in PTL 2. For the study, the inventor of the subject application prepared a circuit diagram based on the technique described in PTL 2. FIG. 5 illustrates the circuit diagram prepared by the inventor of the subject application for the study. Referring to FIG. 5, the study of the inventor of the subject application will be described below.

A high-voltage analog switch circuit illustrated in FIG. 5 includes a main switch circuit and a control circuit for performing on/off control of the main switch circuit. The main switch circuit has two n-channel (first conductive type) insulated gate field effect transistors (hereinafter, referred to as MOSFETs) M1 and M2. Source terminals of the n-channel MOSFETs are connected together into a common source terminal S. In addition, gate terminals of the n-channel MOSFETs M1 and M2 are connected together into a common gate terminal G. Controlling a voltage supplied to the common gate terminal G relative to the common source terminal S turns on the two n-channel MOSFETs M1 and M2 to allow a signal to be transmitted bidirectionally between the two input and output terminals.

The control circuit for performing on/off control of the main switch circuit has a hold circuit (latch circuit), n-channel MOSFETs M5 and M6, diodes D1 and D2. The hold circuit has n-channel MOSFETs M3 and M4, capacitances C1 and C2, zener diodes D3 and D4 connected to the common source terminal of the n-channel MOSFETs M1 and M2. The n-channel MOSFETs M3 and M4 are connected such that the gate terminals and the drain terminals cross each other to form a latch circuit. In addition, the zener diodes D3 and D4 are connected between the gate terminals and the source terminals of their respective MOSFETs, the capacitances C1 and C2 are connected between the source terminals and the drain terminals of their respective MOSFETs.

A set signal (Set) is supplied to the gate terminal of the n-channel MOSFET M5, and a reset signal (Reset) is supplied to the gate terminal of the n-channel MOSFET M6. A power-supply voltage Vdc of the control circuit is connected to one of input and output of the latch circuit via the MOSFET M5 and the diode D1, and is connected to the other of input and output of the latch circuit via the MOSFET M6 and the diode D2. The one of the input and output of the latch circuit is connected to the common gate terminal G of the MOSFETs M1 and M2 constituting the main switch, and the source terminals of the MOSFETs M3 and M4 in the latch circuit are connected to the common source terminal S of the MOSFETs M1 and M2. In FIG. 5, a diode connected between the source terminal and the drain terminal of the MOSFET refers to a body diode. The body diode formed between a semiconductor region (body terminal) in which the MOSFET is formed and the drain terminal by connecting the semiconductor region (body terminal) and the source terminal.

The MOSFET M5 is turned on by the set signal, and the MOSFET M6 is turned off by the reset signal. Accordingly, the capacitance C1 is charged by the power-supply voltage Vdc via the MOSFET M5, and a voltage corresponding to the power-supply voltage Vdc is applied between the common source terminal S and the common gate terminal G, whereby the n-channel MOSFETs M1 and M2 are turned on to bring the main switch circuit into the on state. After the charging of the capacitance C1, even when the MOSFET M5 is turned off, the capacitance C1 and a parasitic capacitance between the common gate terminal G and the common source terminal S hold an electric charge to keep the main switch circuit in the on state. Accordingly, the main switch circuit is kept in the on state without having to continue to turning the MOSFET M5 on, which eliminates the need for constant supply of an electric current and realizes low power consumption.

Meanwhile, the MOSFET M6 is turned on by the reset signal and the MOSFET M5 is turned off by the set signal to charge the capacitance C2 via the MOSFET M6 and shift the MOSFET M3 to on state. Accordingly, the difference in voltage between the common gate terminal G and the common source terminal. S decreases, the n-channel MOSFETs M1 and M2 are turned off, and the main switch circuit is turned off.

In the high-voltage analog switch circuit illustrated in FIG. 5, the control circuit is connected between the voltage of the common source terminal S and the power-supply voltage Vdc, and thus the voltage in the common gate terminal G generated by the control circuit follows the voltage of the common source terminal S. Accordingly, the value of the power-supply voltage Vdc does not need to be equal to or higher than the maximum voltage in a signal supplied to the input and output terminals of the main switch circuit, and the voltage of the power-supply voltage Vdc can be lowered. From the viewpoint of lowering the power-supply voltage Vdc, the characteristics of the n-channel MOSFETs M1 and M2 constituting the main switch circuit are important. The value of the power-supply voltage Vdc needs to be equal to or higher than the gate terminal voltage at which the MOSFETs M1 and M2 can sufficiently operate (turn on). PTL 2 specifies that voltages of several tens of V are used as power-supply voltages.

In addition, when the high-voltage analog switch circuit illustrated in FIG. 5 is used in a semiconductor integrated circuit device, the value of a voltage applied to the back surface of a semiconductor substrate on which MOSFETs constituting the high-voltage analog switch circuit are formed is important as well as the value of the power-supply voltage Vdc illustrated in FIG. 5. For example, the withstand voltage of an MOSFET formed by an SOI (Silicon On Insulator) technique depends on the voltage of a back surface of the substrate. In the case of forming the MOSFETs M1 and M2 by the SOI technique, a negative high voltage may be applied to the back surface of the substrate for improvement in withstand voltage of the MOSFETs.

The inventor of the subject application has concluded that, in the case of forming a high-voltage analog switch circuit in a semiconductor integrated circuit device, the configuration of the high-voltage analog switch circuit, the characteristics of elements used in the circuit configuration such as MOSFETs, and selection of structures were important in lowering a power-supply voltage.

According to PTL 1, for improvement of linearity of the high-voltage analog switch circuit, a high voltage needs to be used to perform on/off control of a bidirectional analog switch circuit formed by two n-channel MOSFETs. Specifically, for on/off control of the bidirectional analog switch circuit, the drive circuit executing the control requires a voltage equal to or higher than the maximum value of positive and negative signals supplied to the input and output terminals of the bidirectional analog switch circuit and a voltage equal to or lower than the minimum value of the same. Accordingly, to control transmission of a signal with the maximum value of ±100 V by the bidirectional analog switch circuit, a high power-supply voltage of ±100 V or higher is required.

None of PTLs 1 and 2 provide any description on lowering of a power-supply voltage to be supplied to the semiconductor integrated circuit device with the high-voltage analog switch circuit.

An object of the present invention is to provide a semiconductor integrated circuit device that has a high-voltage analog switch circuit and is operable at a lower power-supply voltage.

The foregoing and other objects and novel features of the present invention will be clearly understood by the description herein and the accompanying drawings.

Solution to Problem

Of the inventions disclosed herein, a typical one will be briefly described as follows:

The semiconductor integrated circuit device is a semiconductor integrated circuit device that includes high-voltage MOSFETs in a semiconductor region arranged on a main surface of a semiconductor substrate via an insulating substrate. The semiconductor integrated circuit device includes: a first high-voltage MOSFET of a first conductive type with a source terminal, a drain terminal, and a gate terminal; a second high-voltage MOSFET of the first conductive type with a source terminal connected to the source terminal of the first high-voltage MOSFET, a drain terminal, and a gate terminal connected to the gate terminal of the first high-voltage MOSFET; and a first floating gate voltage control circuit. The first floating gate voltage control circuit operates at a voltage falling within the range of a voltage exceeding a ground voltage to a voltage of 5 V or lower as a power-supply voltage, and performs on/off control on the first high-voltage MOSFET and the second high-voltage MOS- FET according to a first control signal. The first floating gate voltage control circuit is connected to the source terminal and the gate terminal of the first high-voltage MOSFET. When turning on the first high-voltage MOSFET and the second high-voltage MOSFET, the first floating gate voltage control circuit sets a voltage in the source terminal of the first high-voltage MOSFET as a reference voltage, generates a floating voltage which adds a voltage corresponding to a power-supply voltage to the reference voltage, and supplies the floating voltage to the gate terminals of the first high-voltage MOSFET and the second high-voltage MOSFET. The first floating gate voltage control circuit operates at a voltage falling within the range of a voltage exceeding a ground voltage to a voltage of 5 V or lower as a power-supply voltage, and therefore the semiconductor integrated circuit device with the high-voltage analog switch circuit can operate at a low voltage as a power-supply voltage.

In addition, in the embodiment, the first floating gate voltage control circuit includes a latch circuit that holds a voltage supplied to the gate terminals of the first high-voltage MOSFET and the second high-voltage MOSFET, a low-voltage MOSFET with a withstand voltage lower than those of the first high-voltage MOSFET and the second high-voltage MOSFET is formed in the semiconductor region arranged on one main surface of the semiconductor substrate via the insulating substrate, and a ground voltage is supplied to a surface of the semiconductor substrate opposed to the one main surface. The voltage supplied to the opposed surface of the semiconductor substrate is a ground voltage, and therefore the semiconductor integrated circuit device does not need a negative high voltage but is operable at a low voltage as a power-supply voltage.

Advantageous Effects of Invention

An advantage provided by a typical one of the inventions disclosed herein will be briefly described as follows:

It is possible to provide a semiconductor integrated circuit device that has a high-voltage analog switch circuit and is operable at a low power-supply voltage.

DESCRIPTION OF EMBODIMENTS

Hereinafter, embodiments of the present invention will be described in detail with reference to the drawings. In all of the drawings for describing the embodiments, the same components are basically given the same reference signs, and overlapping descriptions thereof are basically omitted.

In the following descriptions of a plurality of embodiments, a high-voltage analog switch circuit for use in a medical Diagnostic Ultrasound System is taken as an example. The high-voltage analog switch circuit is built into a semiconductor integrated circuit device, and operates at a power-supply voltage supplied from the outside of the semiconductor integrated circuit device. The semiconductor integrated circuit device is formed by an SOI technique. Although described later with reference to FIG. 4, the Diagnostic Ultrasound System has a transmitter circuit (transmitting drive circuit) that transmits a drive signal for driving ultrasound transducers, and a receiver circuit (receiver processing circuit) that receives electric signals converted by the ultrasound transducers from reflected waves generated by irradiation of ultrasound. In the embodiments, the transmitter circuit and the receiver circuit are formed as one transmitter and receiver circuit, as an example. In addition, the high-voltage analog switch circuit is referred herein to also as high-voltage switch circuit or simply as to switch circuit. The high-voltage analog switch circuit may be regarded as a bidirectional high-voltage analog switch circuit because it transmits signals bidirectionally between two input and output terminals.

(First Embodiment)

Figure 1:
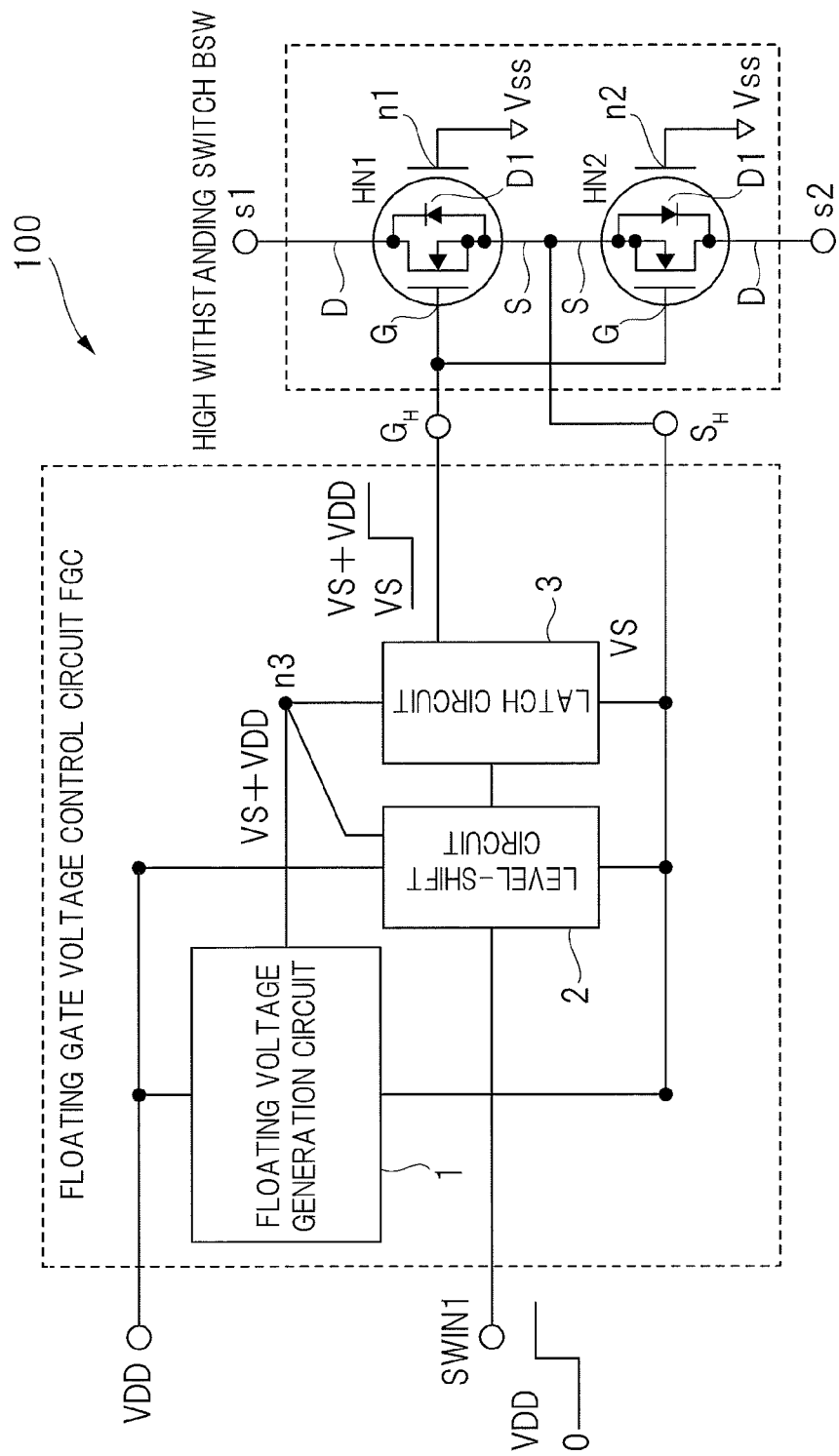
FIG. 1 is a circuit diagram illustrating a configuration of a semiconductor integrated circuit device according to a first embodiment.

FIG. 1 is a circuit diagram illustrating a configuration of a semiconductor integrated circuit device according to a first embodiment. FIG. 1 illustrates a configuration of a high-voltage analog switch circuit 100 built into the semiconductor integrated circuit device. The high-voltage analog switch circuit 100 includes a high-voltage switch BSW, and a floating gate voltage control circuit (hereinafter, referred also as to FG control circuit) FGC that controls on/off states of the high-voltage switch BSW according to the input signal SWIN1.

The high-voltage switch BSW has two high-voltage n-channel MOSFETs HN1 and HN2, and each of the MOSFETs HN1 and HN2 has a source terminal S, a drain terminal D, a gate terminal G, and a body terminal. The source terminals S of the MOSFETs HN1 and HN2 are connected together and connected to a common source terminal $S_H$, and the gate terminals G of the same are also connected together and connected to a common gate terminal $G_H$. The drain terminal D of the MOSFET HN1 is connected to one input and output terminal s1 of the high-voltage switch BSW, and the drain terminal D of the MOSFET HN2 is connected to the other input and output terminal s2 of the high-voltage switch BSW. The body terminals of the MOSFETs HN1 and HN2 are connected to their respective source terminals S.

Referring to FIG. 1, D1 denotes parasitic diodes (body diodes) formed between the body terminals and the drain terminals. Also in FIG. 1, n1 denotes a node of a back surface of the substrate of the MOSFET HN1, and n2 denotes a node of a back surface of the substrate of the MOSFET HN2.

Figure 6:
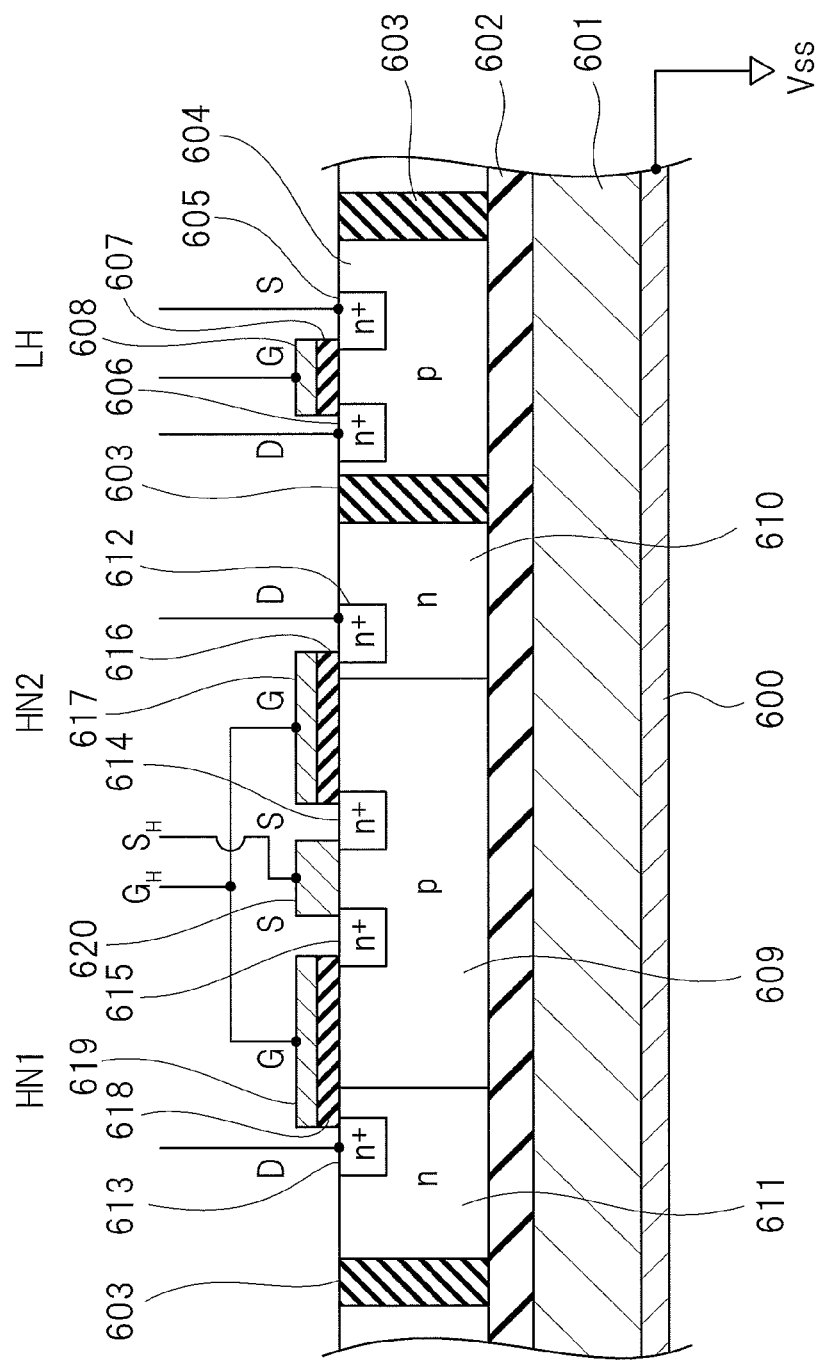
FIG. 6 is a schematic cross-sectional view of the semiconductor integrated circuit device.

Semiconductor elements constituting the MOSFETs HN1 and HN2 (the first high-voltage MOSFET and the second high-voltage MOSFET) and the FG control circuit FGC (the first floating gate voltage control circuit) are formed by an SOI technique. FIG. 6 is a schematic cross-sectional view of the semiconductor integrated circuit device formed by the SOI technique. FIG. 6 illustrates a cross section of a low-voltage MOSFET LH in particular out of the MOSFETs HN1, HN2, and a low-voltage MOSFET LH within the semiconductor elements constituting the FG control circuit FGC.

First, referring to FIG. 6, structures of the MOSFETs HN1, HN2 and the low-voltage MOSFET LH will be described.

In FIG. 6, reference sign 601 denotes a substrate of Si as a semiconductor (semiconductor substrate). An insulating substrate 602 of $SiO_2$ as an insulating layer is formed on one main surface of the substrate (semiconductor substrate) 601. A surface (back surface) of the substrate 601 opposed to the one main surface is fixed electrically and physically to a conductive substrate 600. The conductive substrate 600 is a tub, for example. A ground voltage Vss (0 V) is supplied to the conductive substrate 600. Accordingly, the ground voltage Vss is applied to the opposed surface (back surface) of the substrate 601.

Formed on the insulating substrate 602 are p-type semiconductor regions 609, 604 and n-type semiconductor regions 610, 611. In FIG. 6, reference sign 603 denotes an insulating layer for isolating the semiconductor regions from each other, and is an insulating layer of $SiO_2$, for example. The p-type semiconductor region 609 has $n^+$-type semiconductor regions 614 and 615. The $n^+$-type semiconductor region 614 is a source region of the MOSFET HN2, and the $n^+$-type semiconductor region 615 is a source region of the MOSFET HN1. These source regions correspond to the source terminals S. In addition, these source regions are connected to each other by a conductive layer 620 and also connected to the p-type semiconductor region 609. The conductive layer 620 is connected to the common source terminal $S_H$.

The n-type semiconductor region 610 has an $n^+$-type semiconductor region 612 higher in carrier concentration than the n-type semiconductor region. The $n^+$-type semiconductor region 612 constitutes a drain region of the MOSFET HN2 and corresponds to the drain terminal D. Similarly, the n-type semiconductor region 611 has an $n^+$-type semiconductor region 613 higher in carrier concentration than the n-type semiconductor region. The $n^+$-type semiconductor region 613 constitutes a drain region of the MOSFET HN1 and corresponds to the drain terminal D.

In FIG. 6, reference sign 617 denotes a gate electrode of the MOSFET HN2, which is formed on the semiconductor regions 609 and 610 via a gate insulating film 616. Similarly, reference sign 619 denotes a gate electrode of the MOSFET HN1, which is formed on the semiconductor regions 609 and 611 via a gate insulating film 618. The gate electrodes 617 and 619 correspond to the gate terminals G of the MOSFETs HN2 and HN1, and are connected to the common gate terminal $G_H$.

The p-type semiconductor region 604 has $n^+$-type semiconductor regions 605 and 606. The $n^+$-type semiconductor region 605 constitutes a source region of the low-voltage MOSFET LH (corresponding to the source terminal S), and the $n^+$-type semiconductor region 606 constitutes a drain region of the low-voltage MOSFET LH (corresponding to the drain terminal D). Reference sign 608 denotes a gate electrode of the low-voltage MOSFET LH (corresponding to the gate terminal G). The gate electrode 608 is formed on the semiconductor region 604 via a gate insulating film 607. In FIG. 6, each carrier concentration is not always the same. For example, carrier concentration of the $n^+$-type semiconductor regions in which the high-voltage MOSFET HN1 and HN2 is formed (613, 614, 615, and 615) are not necessary the same as carrier concentration of the $n^+$-type semiconductor regions in which the low-voltage MOSFET LH is formed (605, and 606). Carrier concentration of the p-type semiconductor region in which the high-voltage MOSFET HN1 and HN2 is formed (609) also is not necessary the same as carrier concentration of the p-type semiconductor regions in which the low-voltage MOSFET LH is formed (604).

In the embodiment, the n-type semiconductor regions 611 and 610 with lower carrier concentration are formed to surround the drain regions 613 and 612 of the MOSFETs HN1 and HN2, respectively, such that the MOSFETs HN1 and HN2 have a higher withstand voltage than a withstand voltage of the low-voltage MOSFET LH. That is, the MOSFETs HN1 and HN2 are high-voltage MOSFETs. As a matter of course, the structure of the MOSFETs for higher withstand voltage is not limited to the structure illustrated in FIG. 6.

In FIG. 1, the node n1 of the MOSFET HN1 and the node n2 of the MOSFET HN2 indicate positions on the back surface (opposed surface) of the substrate 601. That is, the node n1 corresponds to the position on the substrate 601 corresponding to the semiconductor region where the MOSFET HN1 is formed, and node n2 corresponds to the position on the substrate 601 corresponding to the semiconductor region where the MOSFET HN2 is formed. In the embodiment, the ground voltage Vss is evenly applied by the conductive substrate 600 to the back surface of the substrate 601, and therefore the node n1 and the node n2 may be regarded as identical.

Returning to FIG. 1, each of the high-voltage MOSFETs HN1 and HN2 is turned on and off such that a difference in voltage between the common source terminal $S_H$ and the common gate terminal $G_H$ falls within the range of low voltages between a voltage exceeding the ground voltage (0 V) and 5 V.

The FG control circuit FGC includes a floating voltage generation circuit 1, a latch circuit 3, and a level-shift circuit 2. The floating voltage generation circuit 1 is connected to a power source voltage VDD, the common source terminal $S_H$, and a node n3. In the embodiment, the power-supply voltage VDD is supplied as an operating voltage to the semiconductor integrated circuit device. The power-supply voltage VDD is supplied to the floating voltage generation circuit 1 via a power-supply voltage terminal VDD. The power-supply voltage VDD is a low voltage within the range of the ground voltage Vss (0 V)<VDD≤5 V (between a voltage exceeding the ground voltage Vss and a voltage of 5 V or lower).

The latch circuit 3 is connected to the node n3 and the common source terminal $S_H$, and output of the latch circuit 3 is output to the common gate terminal $G_H$. In addition, an input signal SWIN1 (first control signal) input into an input terminal SWIN1 is converted in level by the level-shift circuit 2 and input into the latch circuit 3. The input signal SWIN1 is a signal of a logical control signal level and is converted by the level-shift circuit 2 into a floating voltage level. To perform the level conversion, the level-shift circuit 2 is supplied with the power-supply voltage VDD and the voltage in the node n3.

The floating voltage generation circuit 1 generates a floating voltage (VS+VDD) by setting the voltage VS in the common source terminal $S_H$ as a reference (reference voltage) and superimposing a voltage corresponding to the power-supply voltage VDD on the reference voltage VS, and supplies the floating voltage to the node n3.

The latch circuit 3 outputs a control signal with the floating voltage (VS+VDD) or the voltage VS in the common source terminal $S_H$ to the common gate terminal $G_H$ according to the input signal supplied from the level-shift circuit 2, and latches the control signal (voltage). Accordingly, the voltage of the common gate terminal $G_H$ follows the voltage VS in the common source terminal $S_H$ at that time.

The input signal SWIN1 is a signal of a logical control signal level, and its low level is identical to the ground voltage (0 V), and its high level is equal to the power-supply voltage VDD. When the level of the input signal SWIN1 is low, for example, the level-shift circuit 2 supplies a signal with the voltage VS in the common source terminal $S_H$ to the latch circuit 3. Meanwhile, when the level of the input signal SW1N1 is high (VDD), the level-shift circuit 2 supplies a signal with the floating voltage (VS+VDD) to the latch circuit 3. That is, the latch circuit 3 is supplied with the signal of which low level is equal to the voltage VS in the common source terminal $S_H$ and high level is equal to the floating voltage (VS+VDD).

The latch circuit 3 holds the signal supplied from the level-shift circuit 2 and supplies the same to the common gate terminal $G_H$. For example, when being supplied with the signal of which high level is equal to the floating voltage (VS+VDD), the latch circuit 3 supplies the floating voltage (VS+VDD) to the common gate terminal $G_H$. Accordingly, the two high-voltage MOSFETs HN1 and HN2 in the high-voltage switch BSW are both turned on. Meanwhile, when being supplied with the signal of which low level is equal to the voltage VS in the common source terminal $S_H$, the latch circuit 3 supplies the voltage VS in the common source terminal $S_H$ to the common gate terminal $G_H$. Accordingly, the two high-voltage MOSFETs HN1 and HN2 in the high-voltage switch BSW are both turned off.

The latch circuit 3 holds the voltage supplied to the common gate terminal $G_H$ and thus the on or off state of the high-voltage MOSFETs HN1 and HN2 in the high-voltage switch BSW is retained. When the input signal SWIN1 supplied to the input terminal SWIN1 changes, the on or off state of the high-voltage MOSFETs HN1 and HN2 in the high-voltage switch BSW is switched and retained.

When the high-voltage MOSFETs HN1 and HN2 in the high-voltage switch BSW are both turned on, the high-voltage switch BSW is also brought into the on state. At that time, when an input signal is supplied to the input and output terminal s1 or s2, the input signal is transmitted between s1 and s2. By the transmission, the common source terminal $S_H$ becomes equal in voltage to the input and output terminals s1 and s2. The floating voltage generation circuit 1 sets the voltage VS in the common source terminal $S_H$ as a reference, and generates the floating voltage by superimposing the voltage of the power-supply voltage VDD on the voltage of the reference voltage. Therefore, the voltage in the common gate terminal $G_H$ follows the voltage in the common source terminal $S_H$. Accordingly, the voltage of the common gate terminal $G_H$ is held in the latch circuit 3 as the voltage VS in the common source terminal $S_H$ and the power-supply voltage VDD. As a result, the voltage between the common gate terminal $G_H$ and the common source terminal $S_H$ is held at the magnitude of the power-supply voltage VDD, and the on state of the high-voltage switch BSW is held. Similarly, when the high-voltage switch BSW is in the off state and an input signal is applied between the input and output terminals s1 and s2, the bidirectional switch BSW is held in the off state.

As in the foregoing, in the semiconductor integrated circuit device according to the first embodiment, the high-voltage switch circuit 100 operates at the low power-supply voltage VDD that falls within the range between a voltage exceeding the ground voltage (0 V) and a voltage of 5 V or lower. In addition, the semiconductor integrated circuit device operates by applying the ground voltage Vss (0 V) to its back surface of the substrate. Therefore, it is possible to provide a semiconductor integrated circuit device with the high-voltage analog switch circuit 100 that can operate only by power supply at the power-supply voltage VDD or a lower voltage.

(Second Embodiment)

Figure 2:
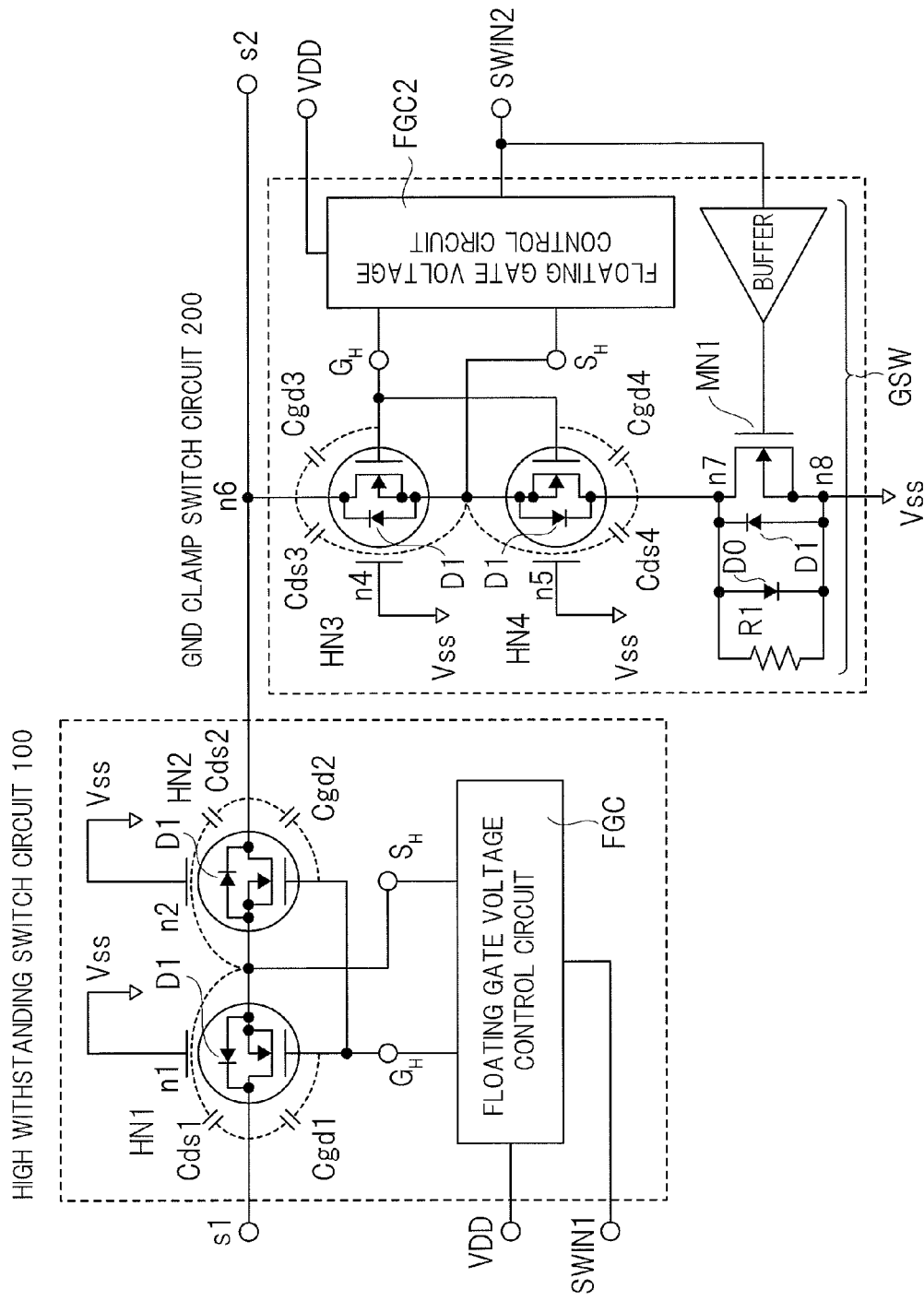
FIG. 2 is a circuit diagram illustrating a configuration of a semiconductor integrated circuit device according to a second embodiment.

FIG. 2 is a circuit diagram illustrating a configuration of a semiconductor integrated circuit device according to a second embodiment. FIG. 2 illustrates the high-voltage switch circuit 100 and a GND clamp switch circuit 200 built into the semiconductor integrated circuit device. A major difference between the semiconductor integrated circuit device according to the second embodiment and the semiconductor integrated circuit device according to the first embodiment is in that, in the second embodiment, the high-voltage switch circuit 100 has the input and output terminal s2 connected to the GND clamp switch circuit. The high-voltage switch circuit 100 according to the second embodiment is configured in the same manner as the high-voltage switch circuit 100 in the first embodiment described above, and detailed description thereof will be omitted. For the sake of description of the second embodiment, FIG. 2 illustrates the high-voltage switch circuit 100 in which examples of parasitic capacitances included in the high-voltage MOSFETs HN1 and HN2 constituting the high-voltage switch BSW are indicated by dashed lines.

In the second embodiment, although there is no particular limitation, a transmitter and receiver circuit in the Diagnostic Ultrasound System is connected to the input and output terminal s1 of the high-voltage switch circuit 100, and an ultrasound transducer is connected to the input and output terminal s2 of the same.

First, examples of parasitic capacitances included in the high-voltage MOSFETs HN1 and HN2 will be described. The parasitic capacitances exist between the terminals. Taking the high-voltage MOSFET HN1 as an example, a drain-source parasitic capacitance Cds1 exists between the drain terminal D and the source terminal S, and a gate-drain parasitic capacitance Cgd1 exists between the gate terminal G and the drain terminal D. Similarly, the high-voltage MOSFET HN2 has a drain-source parasitic capacitance Cds2 and a gate-drain parasitic capacitance Cgd2.

Even when the high-voltage MOSFETs HN1 and HN2 are both turned off and the high-voltage switch BSW is turned off by the input signal SWIN1, an electric charge is accumulated or discharged and a cross-talk occurs via these parasitic capacitances (the drain-source capacitances Cds1, Cds2 and the gate-drain capacitances Cgd1, Cgd2). Even when the high-voltage switch BSW is in the off state, occurrence of a cross-talk results in reduction of off-isolation. In the second embodiment, the GND clamp switch circuit 200 is connected between the input and output terminal s2 of the high-voltage analog switch circuit 100 and the ground voltage Vss to prevent a noise signal or the like resulting from a cross-talk being transmitted to the output destination (ultrasound transducer).

The GND clamp switch circuit 200 has n-channel high-voltage MOSFETs HN3 and HN4 (a third high-voltage MOSFET and a fourth high-voltage MOSFET) identical in structure to the high-voltage MOSFETs HN1 and HN2 in the first embodiment described above. Specifically, the MOSFETs HN3 and HN4 are the same in structure as the MOSFETs HN1 and HN2 illustrated in FIG. 6, and are formed on the insulating substrate on the conductive substrate 600 in a semiconductor region via the substrate 601. As a matter of course, the semiconductor region in which the MOSFETs HN3 and HN4 are formed is electrically insulated from other semiconductor regions (for example, the semiconductor regions 609 to 611 as illustrated in FIG. 6, for example) by the insulating layer 603.

Source terminals of the two high-voltage MOSFETs HN3 and HN4 are connected together and connected to the common source terminal $S_H$, and gate terminals of the same are also connected together and connected to the common gate terminal $G_H$. Body terminals of the high-voltage MOSFETs HN3 and HN4 are connected to their respective source terminals, and nodes n4 and n5 of the same on the back surface of substrate are connected to the ground voltage Vss. The substrate 601 of the high-voltage MOSFETs HN3 and HN4 is also the substrate 601 of the high-voltage MOSFETs HN1 and HN2. Accordingly, although FIG. 2 illustrates nodes on the back surface of substrate of the high-voltage MOSFETs HN1 to HN4 separately for the individual high-voltage MOSFETs (nodes n1, n2, n4, and n5), these nodes may be regarded as one common node. Also in FIG. 2, reference sign Dl denotes parasitic diodes (body diodes) between the body terminals and the drain terminals.

In addition, a drain terminal of the high-voltage MOSFET HN3 is connected to the input and output terminal s2 at the node n6, and a drain terminal of the high-voltage MOSFET HN4 is connected to the GND switch circuit GSW described later. The common source terminal $S_H$ and the common gate terminal $G_H$ of the high-voltage MOSFETs HN3 and HN4 are connected to a floating gate voltage control circuit FGC2 (second floating gate voltage control circuit). The floating gate voltage control circuit FGC2 is configured in the same manner as the floating gate voltage control circuit FGC in the first embodiment described above, except that an input signal SWIN2 (second control signal) is supplied instead of the input signal SWIN1.

To drive an ultrasound transducer by the transmitter and receiver circuit, a large-amplitude drive signal is supplied to the input and output terminal s1, and when the high-voltage switch circuit 100 is turned on, the large-amplitude drive signal is transmitted to the input and output terminal s2 via the high-voltage switch circuit 100. Accordingly, the MOSFETs HN3 and HN4 included in the GND clamp switch circuit 200 and connected to the node n6 are high-voltage MOSFETs.

The input signal SWIN2 supplied to the floating gate voltage control circuit FGC2 is a signal of a logical control signal level, and its low level is equal to the ground voltage (0 V), and its high level of the signal is equal to the power-supply voltage VDD (5 V), as the input signal SWIN1. The floating gate voltage control circuit FGC2 is configured in the same manner as the floating gate voltage control circuit FGC, and thus when the level of the input signal SWIN2 is low, the floating gate voltage control circuit FGC2 latches a signal with the voltage VS in the common source terminal $S_H$ of the high-voltage MOSFETs HN3 and HN4, and supplies the same to the common gate terminal $G_H$ of the high-voltage MOSFETs HN3 and HN4. Meanwhile, when the level of the input signal SWIN2 is high (VDD), the floating gate voltage control circuit FGC2 latches a signal with the floating voltage (VS+VDD) and supplies the same to the common gate terminal $G_H$ of the high-voltage MOSFETs HN3 and HN4.

Specifically, the floating gate voltage control circuit FGC2 supplies the voltage VS in the common source terminal $S_H$ of the high-voltage MOSFETs HN3 and HN4 as a low-level signal to the common gate terminal $G_H$. In addition, the floating gate voltage control circuit FGC2 supplies the floating voltage (VS+VDD) formed by superimposing the power-supply voltage VDD on the voltage VS in the common source terminal $S_H$ as a high-level signal to the common gate terminal $G_H$.

In the period during which the ground voltage Vss is supplied to the drain terminal of the high-voltage MOSFET HN4 and the high-voltage switch circuit 100 is turned off, the input signal SWIN2 is set at the high level (VDD). Accordingly, the floating voltage (VS+VDD) is supplied from the floating gate voltage control circuit FGC2 to the common gate terminal $G_H$ of the high-voltage MOSFETs HN3 and HN4, and the high-voltage MOSFETs HN3 and HN4 are both turned on. As a result, in the period during which the high-voltage switch circuit 100 is in the off state, the noise signal transmitted from the parasitic capacitances Cds1, Cds2, Cgd1, Cgd2, and the like to the input and output terminal s2 is flown into and absorbed in the ground node (Vss) through the high-voltage MOSFETs HN3 and HN4 in the GND clamp switch circuit 200.

The input signal SWIN2 is a signal complementary to the input signal SWIN1. Specifically, when the input signal SWIN1 is at the high level (VDD), the input signal SWIN2 is set at the low level (Vss), and when the input signal SWIN1 is at the low level (Vss), the input signal SWIN2 is set at the high level (VDD). The floating gate voltage control circuit FGC2 operates at the power-supply voltage VDD as the floating gate voltage control circuit FGC does. That is, the floating gate voltage control circuit FGC2 operates at a voltage within the range between a voltage exceeding the ground voltage and a voltage of 5 V or lower as a power-supply voltage. Accordingly, the GND clamp switch circuit 200 can also operate at the power-supply voltage that is a low voltage.

The high-voltage MOSFETs HN3 and HN4 included in the GND clamp switch circuit 200 also have parasitic capacitances between the terminals as the high-voltage MOSFETs HN1 and HN2 do. FIG. 2 illustrates a drain terminal-source terminal parasitic capacitance of the high-voltage MOSFET HN3 as Cds3, and a gate terminal-drain terminal parasitic capacitance of the same as Cgd3. Similarly, FIG. 2 illustrates a drain terminal-source terminal parasitic capacitance of the high-voltage MOSFET HN4 as Cds4, and a gate terminal-drain terminal parasitic capacitance as Cgd4.

When a signal (drive signal or signal from the ultrasound transducer) is transmitted between the input and output terminals s1 and s2, the high-voltage switch circuit 100 is turned on by the input signal SWIN1. At that time, the high-voltage MOSFETs HN3 and HN4 in the GND clamp switch circuit 200 are both turned off. That is, the input signal SWIN2 is set at the low level and the common gate terminal $G_H$ has the voltage VS in the common source terminal $S_H$. At that time, the parasitic capacitances in the high-voltage MOSFETs HN3 and HN4, that is, the drain terminal-source terminal parasitic capacitances Cds3, Cds4 and the gate terminal-drain terminal capacitances Cgd3, cgd4 are coupled to the node n6. These parasitic capacitances coupled to the node n6 act as capacitance loads for a signal transmitted between the input and output terminal s1 and the input and output terminal s2, which may cause deterioration in frequency characteristics of the signal transmitted between the input and output terminals. In the Diagnostic Ultrasound System, the drive signal has a large amplitude of about ±100 V (high amplitude) and a high frequency of several tens of MHz, for example. Accordingly, when the GND clamp switch circuit 200 is turned off, reduction in the capacitances included in the input and output terminals is a very important issue.

In the second embodiment, a drain terminal of the high-voltage MOSFET HN4 in the GND clamp switch circuit 200 is not connected directly to the ground voltage Vss but is connected to the ground voltage Vss via the GND switch circuit GSW.

The GND switch circuit GSW includes a node n7 connected to the drain terminal of the high-voltage MOSFET HN4, a node n8 connected to the ground voltage Vss, an n-channel low-voltage MOSFET MN1, a diode D0, and a resistor R1 that are connected in parallel to each other between the node n7 and the node n8, and a buffer that controls on/off state of the low-voltage MOSFET MN1 according to the input signal SWIN2. The low-voltage MOSFET MN1 has a smaller value of a parasitic capacitance between the terminals as compared to those of the high-voltage MOSFETs HN3 and HN4. Specifically, the drain terminal-source terminal parasitic capacitance of the low-voltage MOSFET MN1 is smaller than the drain terminal-source terminal parasitic capacitances of the high-voltage MOSFETs HN3 and HN4, and the gate terminal-drain terminal capacitance of the low-voltage MOSFET MN1 is also smaller than the gate terminal-drain terminal parasitic capacitances of the high-voltage MOSFETs HN3 and HN4.

The input signal SWIN2 is supplied via the buffer to the gate terminal of the low-voltage MOSFET MN1. The buffer is provided to adjust the timing for turning on and off the low-voltage MOSFET MN1 substantially along with the high-voltage MOSFETs HN3 and HN4. That is, the low-voltage MOSFET MN1 and the high-voltage MOSFETs HN3 and HN4 are controlled to be turned on and off in phase with each other in accordance with the input signal SWIN2. Accordingly, when the high-voltage MOSFETs HN3 and HN4 are turned on by the input signal SWIN2, the ground voltage Vss is supplied to the drain terminal of the high-voltage MOSFET HN4 via the low-voltage MOSFET MN1, and the noise signal or the like is absorbed in the ground node Vss. Meanwhile, when the high-voltage MOSFETs HN3 and HN4 are both turned off by the input signal SWIN2, the low-voltage MOSFET MN1 is also turned off. Accordingly, the drain terminal of the high-voltage MOSFET HN4 is connected to the ground voltage Vss via the small parasitic capacitance of the low-voltage MOSFET MN1. That is, the small parasitic capacitance included in the low-voltage MOSFET MN1 is connected in series with the parasitic capacitances included in the high-voltage MOSFETs HN3 and HN4. As a result, when the high-voltage MOSFETs HN3 and HN4 and the low-voltage MOSFET MN1 are turned off, the capacitance coupled to the node n6 takes dominantly a smaller value of the parasitic capacitance of the low-voltage MOSFET MN1 as compared to the high-voltage MOSFETs HN3 and HN4. This realizes reduction in the capacitance coupled to the node n6. Since the capacitance coupled to the node n6 can be reduced, deterioration in the signal transmitted between the input and output terminals s1 and s2 can also be reduced.

In addition, when the high-voltage MOSFETs HN3 and HN4 are both turned off, a cross-talk may occur via the parasitic capacitances Cds3, Cds4, Cgd3, and Cgd4. When the high-voltage switch circuit 100 according to the embodiment is used in the Diagnostic Ultrasound System, positive and negative large-amplitude drive signals may be transmitted between the input and output terminals s1 and s2. In this case, due to the occurrence of the cross-talk via the parasitic capacitances Cds3, Cds4, Cgd3, and Cgd4, positive and negative large-amplitude noises may be applied to the low-voltage MOSFET MN1 to cause element breakage of the low-voltage MOSFET MN1.

In the embodiment, to prevent breakage of the low-voltage MOSFET MN1, the diode D0 is connected between the node n7 and the node n8. In this case, an anode of the diode D0 is connected to the node n7, and a cathode of the same is connected to the node n8. Meanwhile, the body terminal of the low-voltage MOSFET MN1 is connected to the source terminal of the same, and therefore there exists a body diode D1 in which its cathode is connected to the node n7 and its anode is connected to the node n8. Specifically, the two diodes different in forward bias direction are connected between the node n7 and the node n8 to function as a bidirectional clamp. This makes it possible to prevent the voltage in the node n7 from causing positive and negative large amplitudes. In addition, the resistor R1 connected in parallel to the diode D0 between the node n7 and the node n8 acts to discharge an electric charge accumulated in the clamp diode.

Providing the GND switch circuit GSW makes it possible to, when the GND clamp switch circuit 200 is in the off state, reduce the capacitance included in the node n6 and reduce deterioration in the signal transmitted between the input and output terminals s1 and s2. In addition, providing the diode D0 and the resistor R1 in the GND switch circuit GSW makes it possible to prevent breakage of the low-voltage MOSFET for reducing the capacitance included in the node n6.

FIG. 2 illustrates an example of the GND clamp switch circuit 200 connected to the input and output terminal s2. Alternatively, two GND clamp switch circuits 200 may be prepared and connected to the input and output terminals s1 and s2.

(Third Embodiment)

Figure 3:
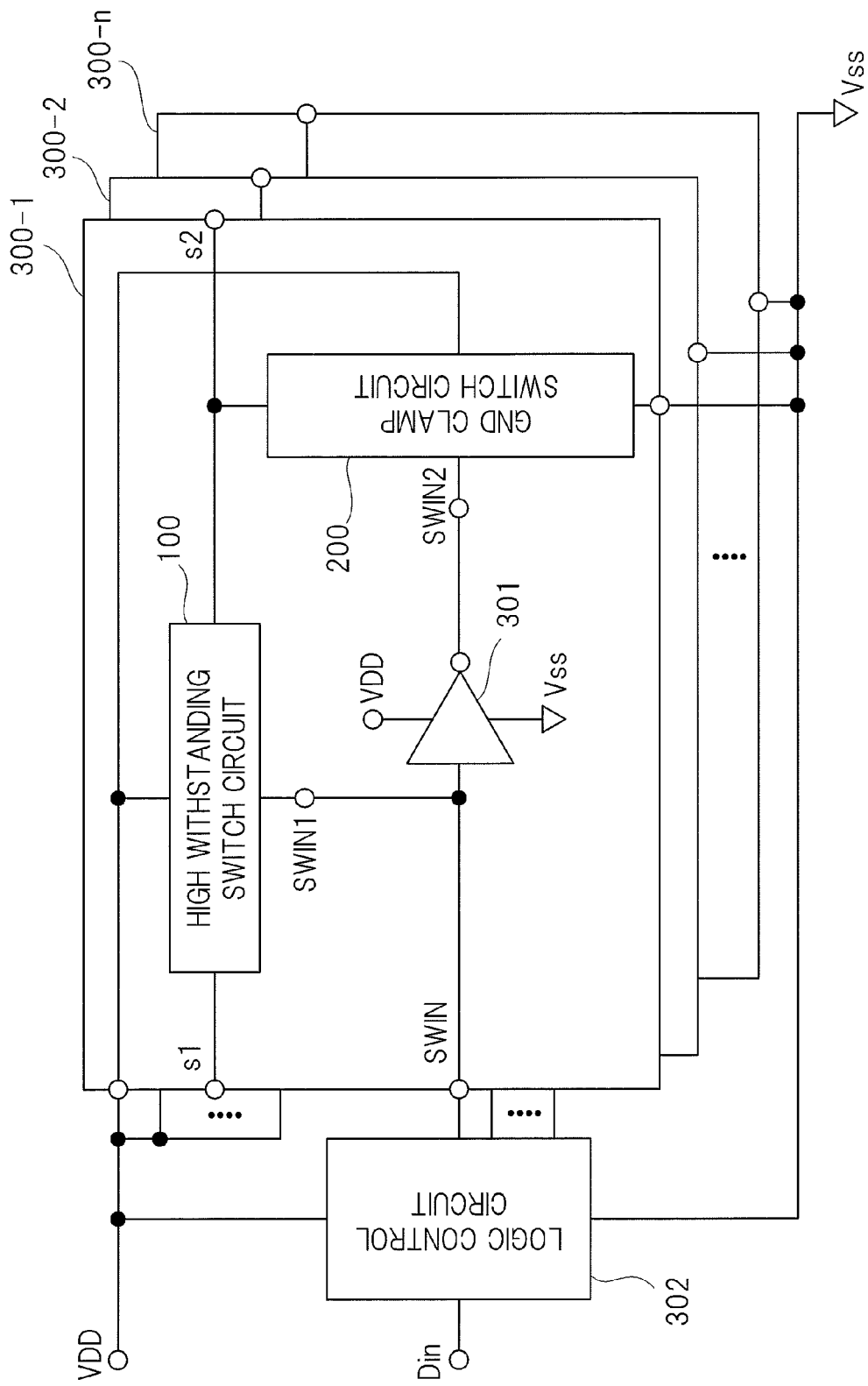
FIG. 3 is a block diagram illustrating a configuration of a semiconductor integrated circuit device according to a third embodiment.

FIG. 3 is a block diagram illustrating a configuration of a semiconductor integrated circuit device according to a third embodiment. In the third embodiment, the high-voltage switch circuit 100 and the GND clamp switch circuit 200 in the second embodiment described above are set as one channel, and a plurality of channels is formed in the semiconductor integrated circuit device. The plurality of channels is configured in the same manner.

In FIG. 3, reference signs 300-1 to 300-n denote channels, and only a configuration of the channel 300-1 is illustrated in detail. The channels 300-1 to 300-n are the same in configuration, and therefore, the channel 300-1 is described here as a representative example and descriptions of the other channels are omitted. The channel 300-1 includes the components in the second embodiment described above and an inverter circuit 301 that generates the input signal SWIN2 from the input signal SWIN1.

Specifically, the channel 300-1 includes the input and output terminals s1 and s2, the high-voltage switch circuit 100, the GND clamp switch circuit 200, the inverter circuit 301, and an input terminal SWIN. In this example, the input and output terminals s1 and s2, the high-voltage switch circuit 100, and the GND clamp switch circuit 200 are the same as those in the second embodiment, and thus descriptions thereof will be omitted. An input signal SWIN supplied to the input terminal SWIN is then supplied to the high-voltage switch circuit 100 as the input signal SWIN1 to the high-voltage switch circuit 100, converted in phase by the inverter circuit 301, and then supplied as the input signal SWIN2 for the GND clamp switch circuit 200 to the GND clamp switch circuit 200. The power-supply voltage VDD is supplied from the power-supply voltage terminal VDD provided in the semiconductor integrated circuit device to the channels 300-1 to 300-n. In addition, the ground voltage Vss is supplied from the ground voltage terminal Vss provided in the semiconductor integrated circuit device to the channels.

In each of the channels, as the channel 300-1 is illustrated in the drawing, the power-supply voltage VDD is supplied to the high-voltage switch circuit 100, the GND clamp switch circuit 200, and the inverter circuit 301, and the ground voltage Vss is also supplied to the GND clamp switch circuit 200 and the inverter circuit 301.

The semiconductor integrated circuit device according to the third embodiment further includes a logical control circuit 302. The logical control circuit 302 is supplied with the power-supply voltage VDD and the ground voltage Vss from the power-supply voltage terminal VDD and the ground voltage terminal Vss provided in the semiconductor integrated circuit device, and operates at the power-supply voltage VDD. The logical control circuit 302 generates the input signal SWIN according to an input signal Din from an input terminal Din provided in the semiconductor integrated circuit device, and supplies the same to the channels.

The high-voltage switch circuit 100 and the GND clamp switch circuit 200 both operate at the low power-supply voltage VDD, and are turned on and off according to the input signal SWIN from the logical control circuit 302 operating at the same power-supply voltage VDD. The low level of the input signal (logical control signal) SWIN is substantially 0 V, and the high level of the same is substantially the power-supply voltage VDD. In this example, the value of the power-supply voltage VDD is a low voltage within the range of a voltage exceeding the ground voltage Vss and a voltage of 5 V or lower ($0 \text{ V} < \text{VDD} \leq 5 \text{ V}$).

Each of the high-voltage switch circuit 100, the GND clamp switch circuit 200, and the inverter circuit 301 is supplied with the low power-supply voltage VDD as an operating voltage, and also receives a signal of 0 V to the power-supply voltage VDD as an input signal to turn on and off and reverse in phase. Specifically, the high-voltage switch circuit 100 is turned on or off by the input signal (logical control signal) SWIN1 in which its low level is 0 V and its high level is equal to the power-supply voltage VDD. The GND clamp switch circuit 200 operates in phase opposite to the high-voltage switch circuit 100. When the high-voltage switch circuit 100 is in the on state, the GND clamp switch circuit 200 is in the off state, and when the high-voltage switch circuit 100 is in the off state, the GND clamp switch circuit 200 is in the on state.

As described above, even though a plurality of channels is integrated on one substrate, the channels operate at the same low power-supply voltage VDD. In this case, the logical control circuit 302 receives the logical input signal Din from the outside, and controls on or off state of the plurality of channels. According to the foregoing configuration, even when a plurality of channels is formed on one semiconductor integrated circuit device, it is possible to provide the semiconductor integrated circuit device for a high-voltage analog switch circuit that is operable with supply of the low power-supply voltage VDD and the ground voltage Vss to the SOI back surface of the substrate, while assuring safety without the need for supply of a high power-supply voltage.

In the third embodiment, the substrate (semiconductor substrate) 601, the conductive substrate 600, and the insulating substrate 602 illustrated in FIG. 6 are shared between the plurality of channels 300-1 to 300-n.

(Fourth Embodiment)

Figure 4:
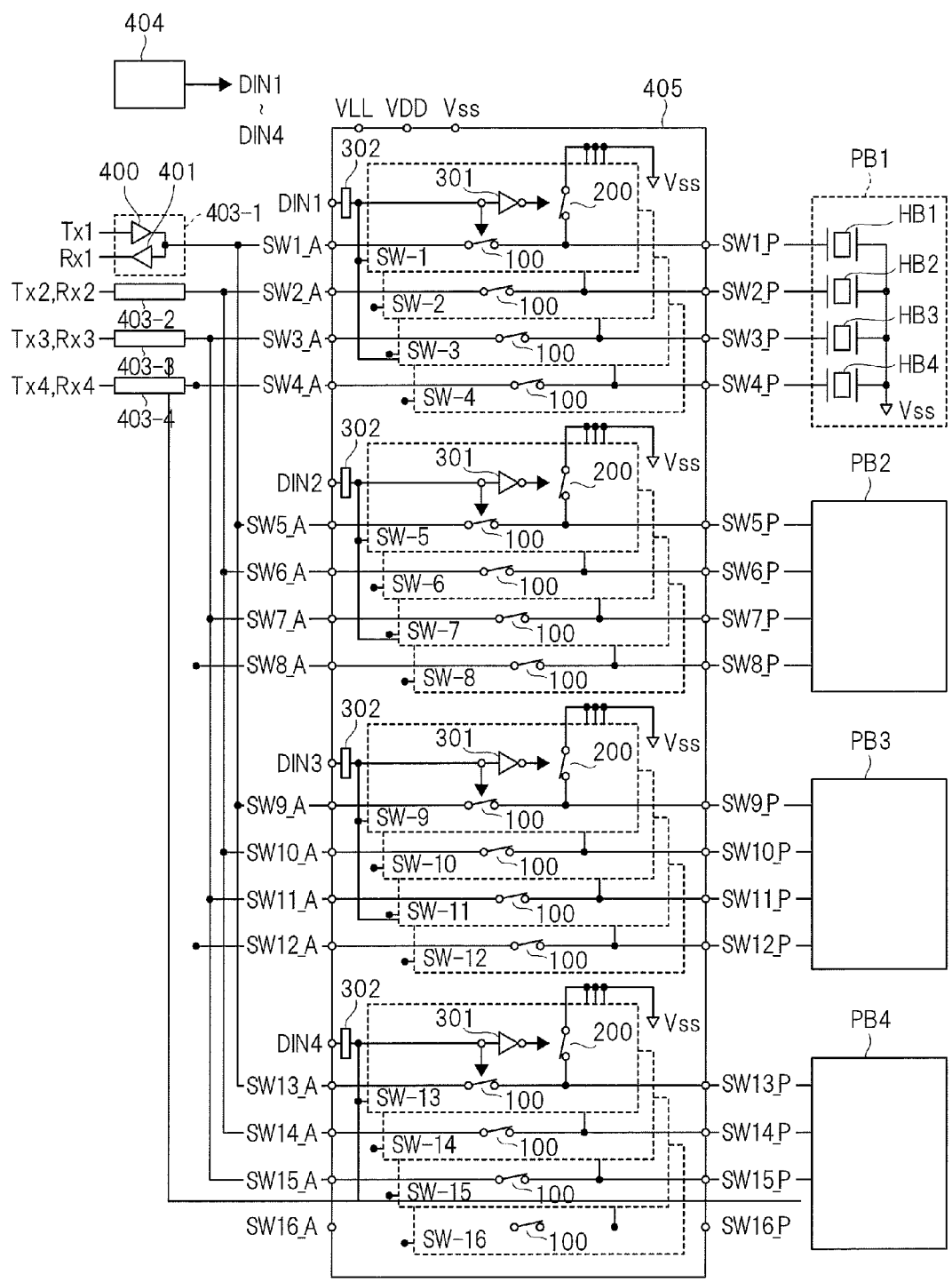
FIG. 4 is a block diagram illustrating a configuration of main components of a Diagnostic Ultrasound System according to a fourth embodiment.
Figure 5:
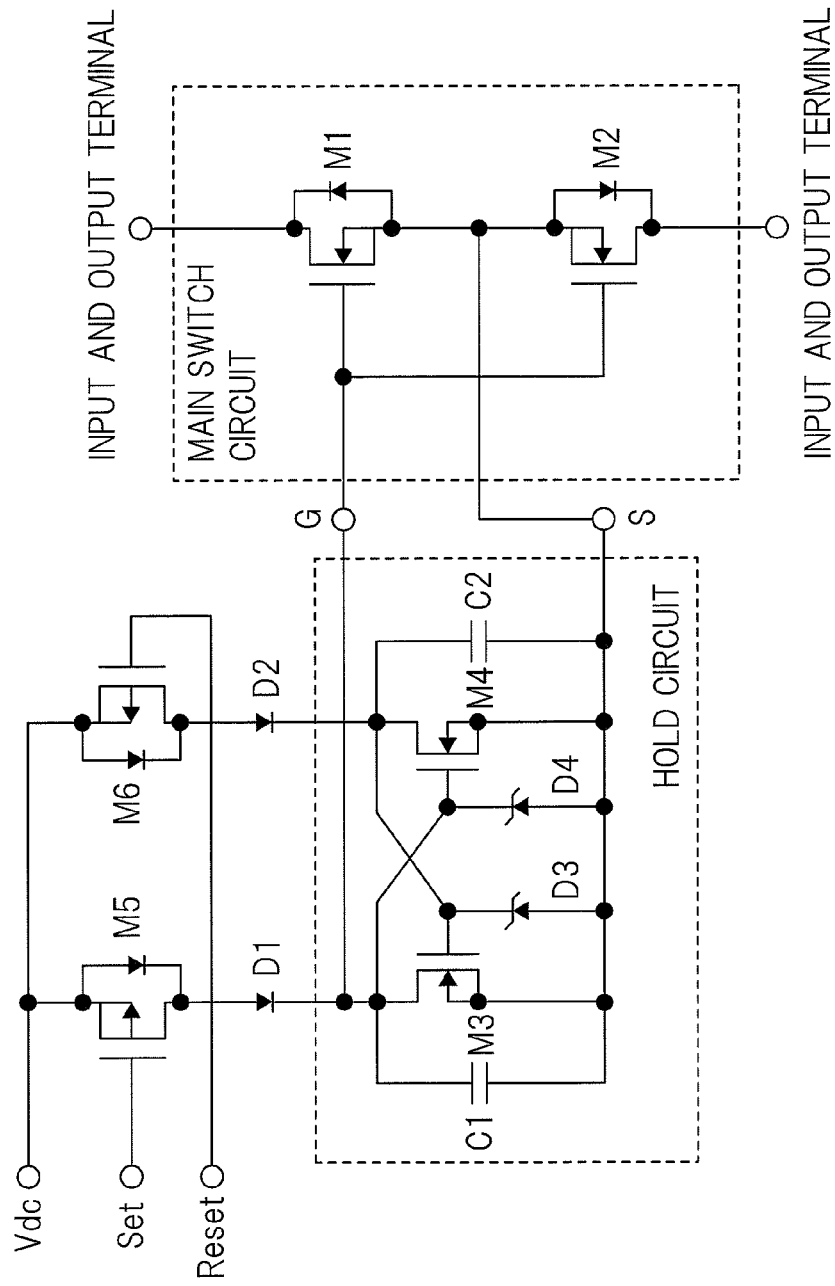
FIG. 5 is a circuit diagram illustrating a configuration of a circuit examined by the inventor of the subject application.

FIG. 4 is a block diagram illustrating main components of a Diagnostic Ultrasound System according to a fourth embodiment. FIG. 4 illustrates a circuit block, ultrasound transducer blocks, and a transmitted wave changeover switch circuit provided in the Diagnostic Ultrasound System. The illustrated circuit block provided in the Diagnostic Ultrasound System includes a portion related to the transmitted wave changeover switch circuit, that is, a control circuit that controls the transmitted wave changeover switch circuit. In addition, the illustrated ultrasound transducer blocks include four blocks PB1 to PB4 each of which includes four ultrasound transducers. In the fourth embodiment, the transmitted wave changeover switch circuit is formed by one semiconductor integrated circuit device 405.

First, the ultrasound transducer blocks PB1 to PB4 will be described. The blocks PB1 to PB4 are configured in the same manner, and thus FIG. 4 illustrates only a configuration of the block PB1. The block PB1 has four ultrasound transducers HB1 to HB4, and first terminals of the ultrasound transducers HB1 to HB4 are connected to an external terminal of the semiconductor integrated circuit device 405 for the transmitted wave changeover switch circuit, and the ground voltage Vss is supplied to the second terminals of the same. The ultrasound transducer blocks PB1 to PB4 are configured in the same manner except that the frequency of generating ultrasound differs among the blocks, for example.

The semiconductor integrated circuit device 405 supplies a drive signal to the first terminals of the ultrasound transducers HB1 to HB4 in the period during which to generate ultrasound (transmitting period). In this case, the drive signal is a large-amplitude signal with a voltage value varying ±100 V relative to the ground voltage Vss (GND). When the drive signal is supplied to the first terminals of the ultrasound transducers HB1 to HB4, the ultrasound transducers HB1 to HB4 generate ultrasound according to the frequency of the drive signal.

The generated ultrasound is reflected on the human body, and the reflected wave is converted by the ultrasound transducers into an electric signal, and the electric signal obtained by the conversion is supplied from the ultrasound transducers to the external terminal of the semiconductor integrated circuit device 405 (receiving period).

The transmitter and receiver circuit provided in the Diagnostic Ultrasound System includes a number of transmitter and receiver circuits corresponding to the number of the ultrasound transducers HB1 to HB4 included in the ultrasound transducer blocks PB1 to PB4. That is, in the embodiment, the transmitter and receiver circuit includes four transmitter and receiver circuits 403-1 to 403-4. The four transmitter and receiver circuits correspond one by one to the ultrasound transducers HB1 to HB4 in the ultrasound transducer blocks PB1 to PB4. For example, the transmitter and receiver circuit 403-1 corresponds to the ultrasound transducers HB1 in the ultrasound transducer blocks PB1 to PB4, the transmitter and receiver circuit 403-2 corresponds to the ultrasound transducers HB2 in the ultrasound transducer blocks PB1 to PB4, the transmitter and receiver circuit 403-3 corresponds to the ultrasound transducers HB3 in the ultrasound transducer blocks PB1 to PB4, and the transmitter and receiver circuit 403-4 corresponds to the ultrasound transducers HB4 in the ultrasound transducer blocks PB1 to PB4.

From another viewpoint, the four ultrasound transducers HB1 share the one transmitter and receiver circuit 403-1, the four ultrasound transducers HB2 share the one transmitter and receiver circuit 403-2, the four ultrasound transducers HB3 share the one transmitter and receiver circuit 403-3, and the four ultrasound transducers HB4 share the one transmitter and receiver circuit 403-4.

The transmitter and receiver circuits 403-1 to 403-4 are configured in the same manner, and thus FIG. 4 illustrates only a configuration of the transmitter and receiver circuit 403-1. The transmitter and receiver circuit 403-1 will be described as a representative example. The transmitter and receiver circuit 403-1 includes a transmitting drive circuit 400 and a receiver processing circuit 401. The transmitting drive circuit 400 receives a drive signal Tx1 formed by a circuit block not illustrated in the Diagnostic Ultrasound System, and supplies a large-amplitude drive signal corresponding to the drive signal Tx1 to the external terminal of the semiconductor integrated circuit device 405 (transmitting period). Meanwhile, the receiver processing circuit 401 is formed by an analog front end circuit, for example, and receives a small-amplitude signal supplied from the external terminal of the semiconductor integrated circuit device 405, and performs a process such as amplification on the signal, and supplies the processed signal as a receiving signal Rx1 to the processing circuit block not illustrated in the Diagnostic Ultrasound System. The processing circuit block (not illustrated) processes the receiving signal Rx1 and displays the same as an image for diagnosis, for example.

Similarly, the other transmitter and receiver circuits 403-2 to 403-4 receive drive signals Tx2 to Tx4, and supply large-amplitude drive signals to the external terminal of the semiconductor integrated circuit device 405 for the transmitting period. In addition, during the receiving period, the transmitter and receiver circuits 403-2 to 403-4 receive small-amplitude signals from the semiconductor integrated circuit device 405, amplify the signals, and supply the signals as receiving signals Rx2 to Rx4 to the processing circuit block (not illustrated).

A control circuit 404 provided in the Diagnostic Ultrasound System generates input signals DIN1 to DIN4 for selection of the ultrasound transducer blocks PB1 to PB4, and supplies the same to the semiconductor integrated circuit device 405.

The semiconductor integrated circuit device 405 in the fourth embodiment constitutes a transmitted wave changeover switch circuit. Although there is no particular limitation, the semiconductor integrated circuit device 405 has 16 channels in the embodiment. That is, the semiconductor integrated circuit device 405 has 16 channels in the third embodiment described above. FIG. 4 illustrates the channels as SW-1 to SW-16. Each of the channels SW-1 to SW-16 includes the high-voltage switch circuit 100, the GND clamp switch circuit 200, and the inverter circuit 301, as the channel 300-1 in the third embodiment described above does. In FIG. 4, for prevention of complexity, the high-voltage switch circuits 100 and the GND clamp switch circuits 200 are indicated with switch symbols. In addition, FIG. 4 illustrates only the inverter circuits 301 and the GND clamp switch circuits 200 for the channels SW-1, SW-5, SW-9, and SW-13 in, but it is to be noted that there are actually the inverter circuits 301 and the GND clamp switch circuits 200 for the other channels.

In the fourth embodiment, the channels SW-1 to SW-16 are separated into four blocks, and the blocks correspond one by one to the ultrasound transducer blocks. Specifically, the channels SW-1 to SW-4 are set in one block corresponding to the ultrasound transducer block PB1, the channels SW-5 to SW-8 are set in one block corresponding to the ultrasound transducer block PB2, the channels SW-9 to SW-12 are set in one block corresponding to the ultrasound transducer block PB3, and the channels SW-13 to SW-16 are set in one block corresponding to the ultrasound transducer block PB4. The logical control circuit 302 in the third embodiment described above is provided to each of the blocks. Specifically, the logical control circuit 302 provided to each of the blocks controls on/off state of the high-voltage switch circuit 100 and the GND clamp switch circuit 200 in the block. The logical control circuits 302 are supplied with input signals DIN1 to DIN4 from the control circuit 404 via external terminals DIN1 to DIN4 provided to the semiconductor integrated circuit device 405.

For example, referring to FIG. 4, the logical control circuit 302 corresponding to the top block of the channels SW-1 to SW-4 is supplied with the input signal DIN1 via the external terminal DIN1. Similarly, the logical control circuits 302 corresponding to the other blocks are supplied with the input signals DIN2 to DIN4.

When the user specifies desired one of the ultrasound transducer blocks PB1 to PB4, one of the input signals DIN1 to DIN4 corresponding to the specified ultrasound transducer block is set at the high level (VDD), and the other input signals are set at the low level (Vss). When the input signal, for example, DIN1 is set at the high level and the other input signals DIN2 to DIN4 are set at the low level, the logical control circuit 302 supplied with the high-level input signal DIN1 supplies the input signal SWIN (FIG. 3) at the high level (VDD) to the inverter circuit 301, and the other logical control circuits 302 supply the input signals SWIN (refer to FIG. 3) at the low level (Vss) to the inverter circuit 301. Accordingly, as described above in relation to the third embodiment, the high-voltage switch circuits 100 in the channels SW-1 to SW-4 are turned on, and the GND clamp switch circuits 200 in the same are turned off. At that time, in the other channels SW-5 to SW-16, the high-voltage switch circuits 100 are turned on, and the GND clamp switch circuits 200 are turned off.

When the high-voltage switch circuits 100 in the channels SW-1 to SW-4 are turned on, external input and output terminals SW1_A to SW4_A in the semiconductor integrated circuit device 405 and external input and output terminals SW1_P to SW4_P of the semiconductor integrated circuit device 405 are electrically connected together, respectively, via the high-voltage switch circuits 100. When operating state is the period of electrically connection and transmitting, the transmitter and receiver circuits 403-1 to 403-4 supply large-amplitude drive signals to first terminals of the ultrasound transducers HB1 to HB4 in the ultrasound transducer block PB1. Accordingly, the ultrasound transducers HB1 to HB4 in the ultrasound transducer block PB1 generate ultrasound according to the large-amplitude drive signals.

Meanwhile, when operating state is the period of electrical connection and receiving period, small-amplitude electric signals converted at the ultrasound transducers HB1 to HB4 in the ultrasound transducer block PB1 are supplied to the transmitter and receiver circuits 403-1 to 403-4 via the semiconductor integrated circuit device 405, and the transmitter and receiver circuits 403-1 to 403-4 supply receiving signals Rx1 to Rx4 corresponding to the received small-amplitude signals to the processing circuit block not illustrated.

When the high-voltage switch circuits 100 in the channels SW-1 to SW-4 are in the on state, the channels SW-5 to SW-16 are in the off state, and thus the external input and output terminals SW5_A to SW16_A and the external input and output terminals SW5_P to SW16_P of the semiconductor integrated circuit device 405 are electrically disconnected from each other, and the external input and output terminals SW5_P to SW16_P are electrically connected to the ground voltage Vss by the GND clamp switch circuits 200.

Similarly, when any of the input signals DIN2 to DIN4 is set at the high level (VDD) by the user's specification, the ultrasound transducers in the ultrasound transducer block corresponding to the input signal at the high level and the transmitter and receiver circuits 403-1 to 403-4 are electrically connected via the semiconductor integrated circuit device 405. That is, it is possible to select four of the 16 channels by the input signals (logical control signals) DIN1 to DIN4, and turn on the high-voltage switch circuits 100 in the selected four channels substantially at the same time.

In the fourth embodiment, the high-voltage switch circuits 100, the GND clamp switch circuits 200, and the four logical control circuits 302 constituting the 16 channels are formed on one insulating substrate by an SOI technique as one semiconductor integrated circuit device 405. That is, the substrate 601, the conductive substrate 600, and the insulating substrate 602 described in FIG. 6 are shared among the 16 channels. Although there is not particular limitation, the semiconductor integrated circuit device 405 is provided with an external power supply terminal VDD to which the power-supply voltage VDD is supplied, an external ground voltage terminal Vss to which the ground voltage Vss is supplied, and an external power supply terminal VLL to which a logical interface power supply VLL is supplied.

The power-supply voltage VDD supplied from the external power-supply terminal VDD to the high-voltage switch circuits 100, the inverter circuits 301, and the GND clamp switch circuits 200 in the 16 channels (refer to FIG. 3). In addition, the ground voltage Vss supplied from the external ground voltage terminal Vss to the GND clamp switch circuits 200, the inverter circuits 301, and the logical control circuits 302 in the 16 channels (refer to FIG. 3). Further, the ground voltage Vss is supplied to the external ground voltage terminal Vss is also supplied to the conductive substrate 600 shared among the channels (refer to FIG. 6), and supplied to the nodes n1, n2, n4, and n5 (refer to FIG. 2).

The logical interface power supply VLL is supplied to four logical control circuits 302, for example. The logical interface power supply VLL is used as a reference voltage for determining signal levels of the input signals DIN1 to DIN4 supplied from the outside of the semiconductor integrated circuit device 405. Therefore, the voltage value of the logical interface power supply VLL is preset according to the signal levels of the input signals DIN1 to DIN4. When the signal levels of the input signals DIN1 to DIN4 are set to 5 V at the high level (VDD) and set virtually to 0 V at the low level (Vss), the logical interface power supply VLL is regarded to have a voltage between 5 V at the high level and 0 V at the low level. The logical control circuits 302 determine the voltages of the input signals DIN1 to DIN4 with the voltage of the logical interface power supply VLL as a reference voltage, and decide the voltage of the input signal SWIN. As a matter of course, the logical interface power supply VLL may be omitted or the voltage of the logical interface power supply VLL may be set by dividing the power-supply voltage VDD.

In the fourth embodiment, the power-supply voltage VDD of the semiconductor integrated circuit device 405 falls within the range between a voltage exceeding the ground voltage and a voltage of 5 V, and the ground voltage Vss of the semiconductor integrated circuit device 405 is substantially 0 V. Accordingly, the semiconductor integrated circuit device 405 used as a transmitted wave changeover switch circuit does not need a high power-supply voltage higher than 5 V but operates only at the low power-supply voltage of 5 V or lower. That is, for example, the signals transmitted by the high-voltage switch circuits 100 are large-amplitude analog signals (drive signals) of ±100 V in the transmitting period, and are small-amplitude analog signals in the receiving period, but the power-supply voltage VDD supplied to the semiconductor integrated circuit device 405 only needs to be a low power-supply voltage of 5 V or lower.

In the fourth embodiment, the semiconductor integrated circuit device 405 and the ultrasound transducer blocks PB1 to PB4 are built into one probe, for example. In this case, since the power-supply voltage VDD supplied to the semiconductor integrated circuit device 405 is low, it is possible to provide safety of the Diagnostic Ultrasound System. In addition, since the power-supply voltage VDD is low, it is possible to thin cable wires electrically connecting the Diagnostic Ultrasound System and the probe. Further, generating the logical interface power supply VLL from the power-supply voltage VDD realizes a single-power-supply voltage configuration and allows reduction in the number of cable wires. This also improves operability of the probe.

As in the foregoing, embodiments of the present invention devised by the inventor are specifically described. However, the present invention is not limited to the foregoing embodiments but can be modified in various manners without deviating from the gist of the invention. The present invention is described above taking a Diagnostic Ultrasound System as an example. However, since the present invention allows a switch circuit to operate at a low power-supply voltage of 5 V or lower, the present invention is not limited to devices in the medical fields but is also applicable to other technical fields to provide safety of devices and/or improve mobility of the devices. In addition, the n-channel MOSFETs are described above as an example of MOSFETs. As a matter of course, MOSFETS may be p-channel MOSFETs.

REFERENCE SIGNS LIST

HN1 to HN4 high-voltage n-channel MOSFETs
$S_H$ common source terminal
$G_H$ common gate terminal
s1 to s2 input and output terminals
VDD low voltage power supply between a voltage exceeding 0
V and a voltage of 5 V or lower
VS voltage in common source terminal
SWIN1, SWIN2 input terminals (input signals)
Din logical input terminal (input signal)
Cds1 to Cds4 source-drain parasitic capacitances
Cgd1 to Cgd4 gate-drain parasitic capacitances
MN1 low-voltage n-channel MOSFET
R1 resistor
D0 diode
SW1_A to SW16_A, SW1_P to SW16_P external input and output terminals
DIN1 to DIN4 external input terminals (input signals)
VLL logical interface power supply

The invention claimed is:

1. A semiconductor integrated circuit device, including a high-voltage MOSFET in a semiconductor region arranged on a main surface of a semiconductor substrate via an insulating substrate, the semiconductor integrated circuit device comprising:
a first high-voltage MOSFET of a first conductive type having a source terminal, a drain terminal, and a gate terminal;

a second high-voltage MOSFET of the first conductive type having a source terminal connected to the source terminal of the first high-voltage MOSFET, a gate terminal connected to the gate terminal of the first high-voltage MOSFET, and a drain terminal; and a first floating gate voltage control circuit configured to operate at a voltage within the range between a voltage exceeding a ground voltage and a voltage of 5 V or lower as a power-supply voltage and control on/off states of the first high-voltage MOSFET and the second high-voltage MOSFET according to a first control signal, the first floating gate voltage control circuit being connected to a source terminal of the first high-voltage MOSFET and a gate terminal of the first high-voltage MOSFET, and when turning on the first high-voltage MOSFET and the second high-voltage MOSFET, the first floating gate voltage control circuit setting a voltage in the source terminal of the first high-voltage MOSFET as a reference voltage, adding a floating voltage corresponding to the power-supply voltage to the reference voltage, and supplying the floating voltage to the gate terminals of the first high-voltage MOSFET and the second high-voltage MOSFET.

2. The semiconductor integrated circuit device according to claim 1, wherein the first floating gate voltage control circuit includes a latch circuit that holds the voltage to be supplied to the gate terminals of the first high-voltage MOSFET and the second high-voltage MOSFET, a low-voltage MOSFET with a lower withstand voltage than those of the first high-voltage MOSFET and the second high-voltage MOSFET is formed in the semiconductor region arranged on the one main surface of the semiconductor substrate via the insulating substrate, and the ground voltage is supplied to a surface of the semiconductor substrate opposed to the one main surface.

3. The semiconductor integrated circuit device according to claim 2, comprising a ground voltage clamp circuit that is connected between the ground voltage and the drain terminal of the first high-voltage MOSFET and/or the drain terminal of the second high-voltage MOSFET, wherein the ground voltage clamp circuit includes a third high-voltage MOSFET of the first conductive type that has a drain terminal, a source terminal, and a gate terminal connected to the drain terminal of the first high-voltage MOSFET and/or the drain terminal of the second high-voltage MOSFET, a fourth high-voltage MOSFET of the first conductive type that has a source terminal connected to the source terminal of the third high-voltage MOSFET, a drain terminal connected to the ground voltage, and a gate terminal connected to the gate terminal of the third high-voltage MOSFET, and a second floating gate voltage control circuit configured to operate at a voltage within the range between a voltage exceeding a ground voltage and a voltage of 5 V or lower as a power-supply voltage and control on/off states of the third high-voltage MOSFET and the fourth high-voltage MOSFET, wherein the second floating voltage control circuit is connected to the source terminal of the third high-voltage MOSFET and the gate terminal of the third high-voltage MOSFET, the second floating voltage control circuit sets a voltage in the source terminal of the third high-voltage MOSFET as a reference voltage, and when turning on the third high-voltage MOSFET and the fourth high-voltage MOSFET, the second floating voltage control circuit adds a floating voltage corresponding to the power-supply voltage to the reference voltage, and supplies the floating voltage to the gate terminals of the third high-voltage MOSFET and the fourth high-voltage MOSFET.

4. The semiconductor integrated circuit device according to claim 3, wherein the ground voltage clamp circuit includes a low-voltage MOSFET of the first conductive type that has a drain terminal connected to the drain terminal of the fourth high-voltage MOSFET, a source terminal connected to the ground voltage, and a gate terminal, and a second control signal with one signal voltage corresponding to the power-supply voltage and the other signal voltage corresponding to the ground voltage is supplied to the gate terminal of the low-voltage MOSFET to control the low-voltage MOSFET to turn on in synchronization with the third high-voltage MOSFET and the fourth high-voltage MOSFET.

5. The semiconductor integrated circuit device according to claim 4, wherein the ground voltage clamp circuit includes a diode that is connected between the source terminal and the drain terminal of the low-voltage MOSFET, and forms a bidirectional diode in conjunction with a body diode formed between the drain terminal of the low-voltage MOSFET and the semiconductor region in which the low-voltage MOSFET is formed, and a resistor connected between the drain terminal and the source terminal of the low-voltage MOSFET.

6. The semiconductor integrated circuit device according to claim 3, comprising:

one or more channels; and a logical control circuit configured to operate at a voltage within the range between a voltage exceeding a ground voltage and a voltage of 5 V or lower as a power-supply voltage and supply a third control signal to the one or more channels, wherein the one or more channels include the first high-voltage MOSFET, the second high-voltage MOSFET, the first floating gate voltage control circuit, and the ground voltage clamp circuit, the first control signal is generated at the first floating gate voltage control circuit according to the third control signal from the logical control circuit, and on/off states of the third high-voltage MOSFET and the fourth high-voltage MOSFET at the ground voltage clamp circuit are controlled by the third control signal.

7. The semiconductor integrated circuit device according to claim 4, comprising:

one or more channels; and a logical control circuit configured to operate at a voltage within the range between a voltage exceeding a ground voltage and a voltage of 5 V or lower as a power-supply voltage and supply a third control signal to the one or more channels, wherein the one or more channels include the first high-voltage MOSFET, the second high-voltage MOSFET, the first floating gate voltage control circuit, and the ground voltage clamp circuit, the first control signal is generated at the first floating gate voltage control circuit according to the third control signal from the logical control circuit, and on/off states of the third high-voltage MOSFET and the fourth high-voltage MOSFET at the ground voltage clamp circuit are controlled by the third control signal.

8. The semiconductor integrated circuit device according to claim 5, comprising:

one or more channels; and a logical control circuit configured to operate at a voltage within the range between a voltage exceeding a ground voltage and a voltage of 5 V or lower as a power-supply voltage and supply a third control signal to the one or more channels, wherein the one or more channels include the first high-voltage MOSFET, the second high-voltage MOSFET, the first floating gate voltage control circuit, and the ground voltage clamp circuit, the first control signal is generated at the first floating gate voltage control circuit according to the third control signal from the logical control circuit, and on/off states of the third high-voltage MOSFET and the fourth high-voltage MOSFET at the ground voltage clamp circuit are controlled by the third control signal.

* * * * *